(12) United States Patent  
Fornage

(10) Patent No.: US 8,183,852 B2
(45) Date of Patent: May 22, 2012

(54) METHOD AND APPARATUS FOR DETERMINING AC VOLTAGE WAVEFORM ANOMALIES

(75) Inventor: Martin Fornage, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 380 days.

(21) Appl. No.: 12/587,516

(22) Filed: Oct. 8, 2009

(65) Prior Publication Data

US 2010/0085035 A1 Apr. 8, 2010

Related U.S. Application Data

(60) Provisional application No. 61/195,606, filed on Oct. 8, 2008.

(51) Int. Cl.
*G01R 23/16* (2006.01)
(52) U.S. Cl. ............... 324/76.12; 324/76.38; 324/76.53
(58) Field of Classification Search .................. None
See application file for complete search history.

(56) References Cited

U.S. PATENT DOCUMENTS

| 5,278,512 A | 1/1994 | Goldstein |
| 5,729,145 A | 3/1998 | Blades |
| 5,995,391 A | 11/1999 | Davies et al. |
| 6,172,889 B1 * | 1/2001 | Eguchi et al. ............ 363/95 |
| 2002/0043962 A1 | 4/2002 | Taniguchi et al. |
| 2005/0190828 A1 | 9/2005 | Hsu et al. |

OTHER PUBLICATIONS

International Search Report and Written Opinion mailed Jun. 3, 2010 for PCT Application No. PCT/US2009/059999.

* cited by examiner

*Primary Examiner* — Minh N Tang
(74) *Attorney, Agent, or Firm* — Moser Taboada

(57) ABSTRACT

A method and apparatus for determining AC voltage waveform anomalies. The apparatus comprises a threshold generator for generating at least one time-variant threshold based on information regarding an AC voltage waveform. The apparatus further comprises a threshold detector for comparing a sample of the AC voltage waveform to the at least one time-variant threshold to identify an AC voltage waveform anomaly.

20 Claims, 5 Drawing Sheets

METHOD AND APPARATUS FOR DETERMINING AC VOLTAGE WAVEFORM ANOMALIES

CROSS-REFERENCE TO RELATED APPLICATIONS

This application claims benefit of U.S. provisional patent application Ser. No. 61/195,606, filed Oct. 8, 2008, which is herein incorporated in its entirety by reference.

BACKGROUND OF THE INVENTION

1. Field of the Invention

Embodiments of the present disclosure generally relate to power conversion, and more specifically, to detecting AC grid voltage anomalies during power conversion.

2. Description of the Related Art

Solar panels have historically been deployed in mostly remote applications, such as remote cabins in the wilderness or satellites, where commercial power was not available. Due to the high cost of installation, solar panels were not an economical choice for generating power unless no other power options were available. However, the worldwide growth of energy demand is leading to a durable increase in energy cost. In addition, it is now well established that the fossil energy reserves currently being used to generate electricity are rapidly being depleted. These growing impediments to conventional commercial power generation make solar panels a more attractive option to pursue.

Solar panels, or photovoltaic (PV) modules, convert energy from sunlight received into direct current (DC). The PV modules cannot store the electrical energy they produce, so the energy must either be dispersed to an energy storage system, such as a battery or pumped hydroelectricity storage, or dispersed by a load. One option to use the energy produced is to employ one or more inverters to convert the DC current into an alternating current (AC) and inject the AC current onto the commercial power grid. The power produced by such a distributed generation (DG) system can then be sold to the commercial power company.

When coupling generated AC current to the commercial power grid, the AC current must be coupled such that it is in-phase with the AC commercial grid voltage. In order to achieve this, grid-connected DG systems receive a reference signal, i.e., a reference of the AC grid voltage, from the commercial power grid and phase-lock to the grid reference signal. As such, zero-crossings of the AC grid voltage are utilized to ensure that the injected AC current and the AC grid voltage are phase-aligned. However, in some instances, the AC grid voltage may experience irregular zero-crossings, causing the DG system to improperly inject the generated AC current onto the commercial power grid and resulting in damage to the DG system.

Therefore, there is a need in the art for a method and apparatus for identifying anomalous AC grid voltage zero-crossings and operating a grid-connected DG system accordingly.

SUMMARY OF THE INVENTION

Embodiments of the present invention generally relate to a method and apparatus for determining AC voltage waveform anomalies. The apparatus comprises a threshold generator for generating at least one time-variant threshold based on information regarding an AC voltage waveform. The apparatus further comprises a threshold detector for comparing a sample of the AC voltage waveform to the at least one time-variant threshold to identify an AC voltage waveform anomaly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
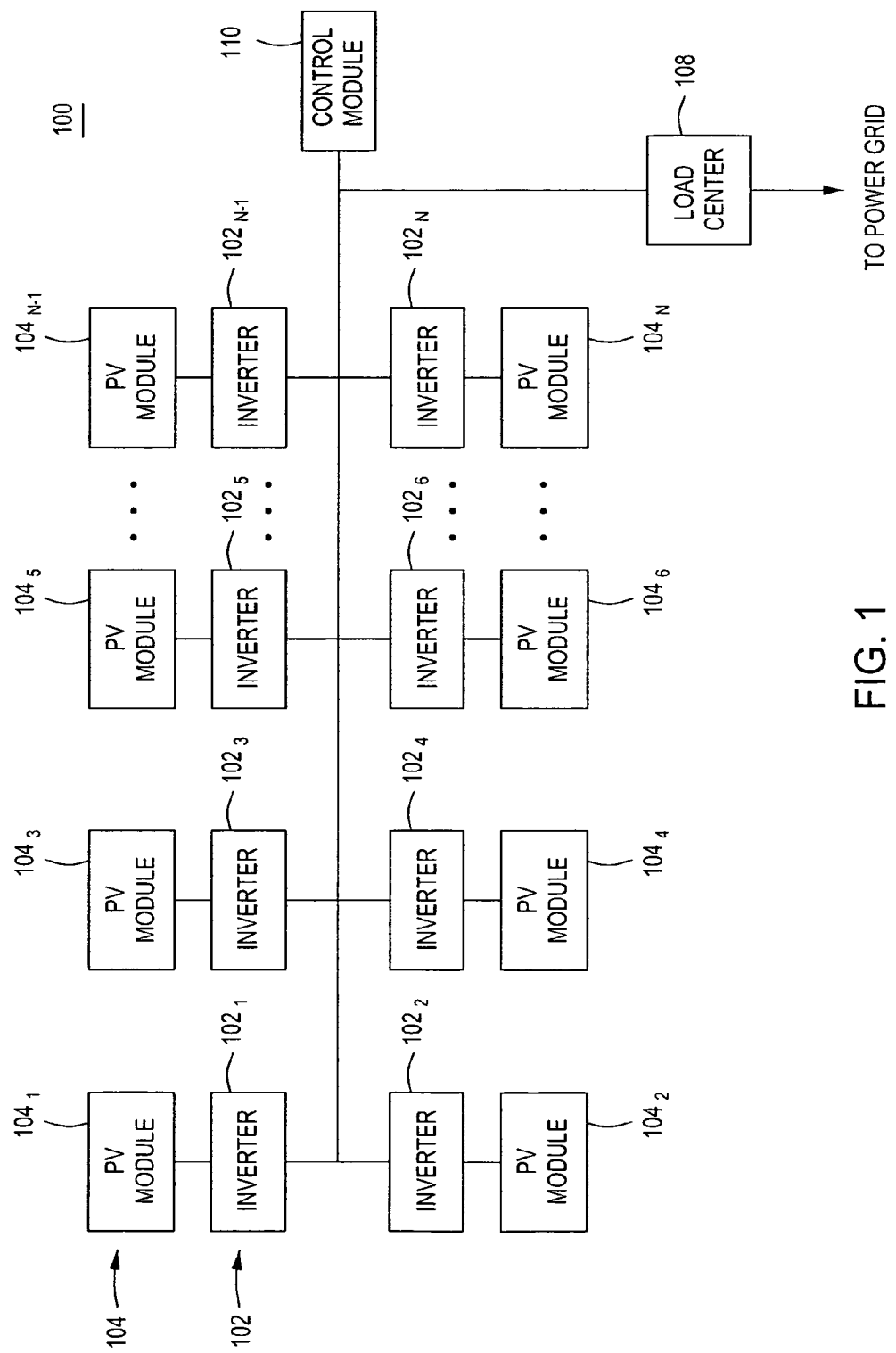
FIG. 1 is a block diagram of a system for distributed generation (DG) in accordance with one or more embodiments of the present invention.

FIG. 1 is a block diagram of a system 100 for distributed generation (DG) in accordance with one or more embodiments of the present invention. This diagram only portrays one variation of the myriad of possible system configurations. The present invention can function in a variety of distributed power generation environments and systems.

The system 100 comprises a plurality of inverters $102_1$, $102_2$ ... $102_n$, collectively referred to as inverters 102, a plurality of PV modules $104_1$, $104_2$ ... $104_n$, collectively referred to as PV modules 104, an AC bus 106, and a load center 108.

Each inverter $102_1$, $102_2$ ... $102_n$, is coupled to a PV module $104_1$, $104_2$ ... $104_n$, respectively, in a one-to-one correspondence for inverting the DC power generated by the PV modules 104 to AC power (i.e., AC current); in some alternative embodiments, more than one PV module 104 may be coupled to an inverter 102. The inverters 102 are coupled to the AC bus 106, which in turn is coupled to the load center 108. The load center 108 houses connections between incoming power lines from a commercial power grid distribution system and the AC bus 106. The inverters 102 convert DC power generated by the PV modules 104 into AC power, and meter out AC current that is in-phase with the AC commercial power grid voltage. The system 100 couples the generated AC power to the commercial power grid via the load center 108.

In accordance with one or more embodiments of the present invention, each inverter 102 obtains and utilizes a reference signal from the commercial power grid to identify anomalous AC grid voltage activity and to temporarily shut down the inverter 102 as necessary based on the identified anomalous activity.

In some embodiments, a DC/DC converter may be coupled to each PV module 104 (e.g., one converter per PV module 104). In some alternative embodiments, multiple PV modules 104 may be coupled to a single inverter (i.e., a centralized inverter); in some such embodiments, one or more DC/DC converters may be coupled between the PV modules and the centralized inverter.

Figure 2:
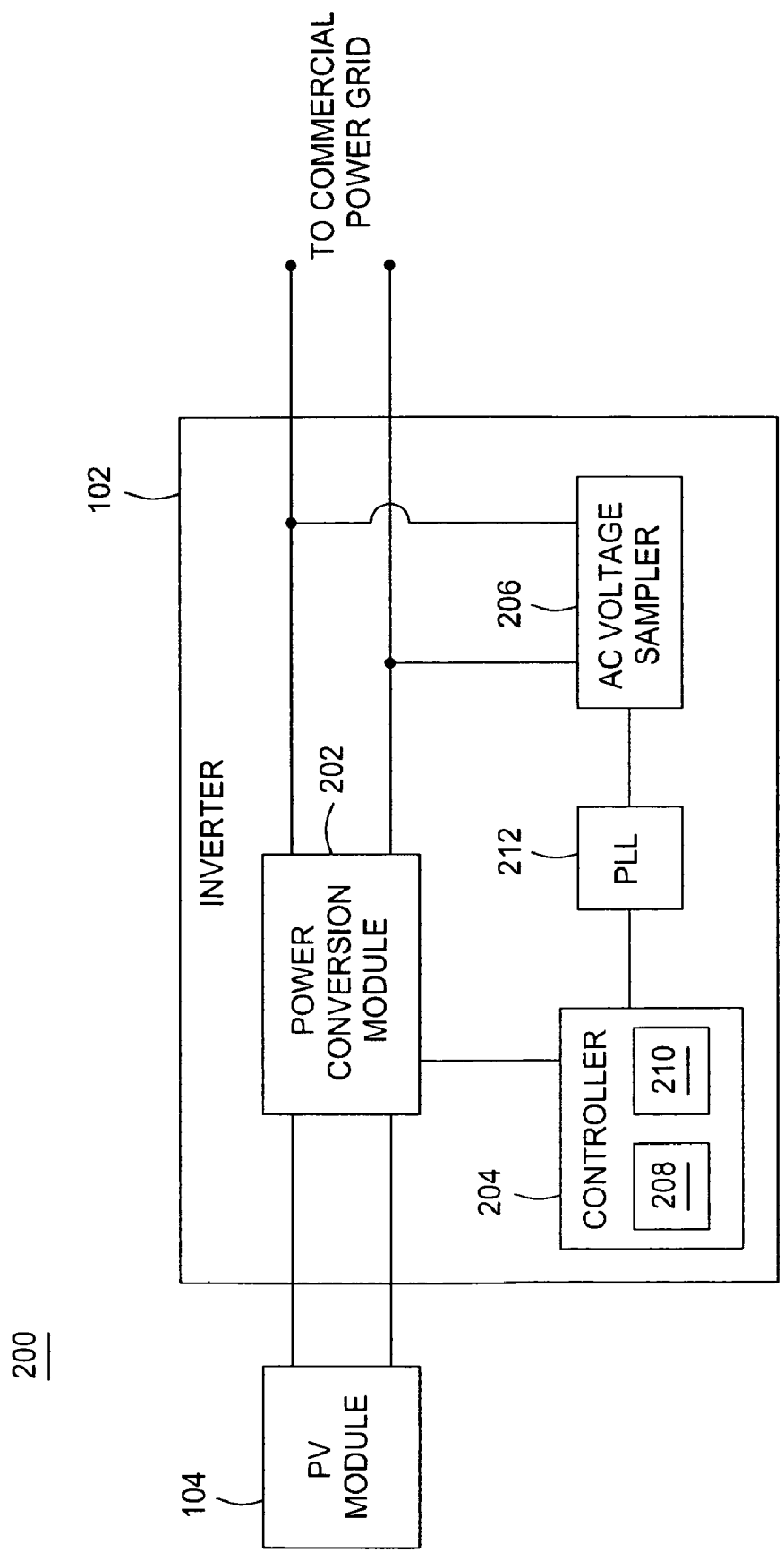
FIG. 2 is a block diagram of an inverter in accordance with one or more embodiments of the present invention.

FIG. 2 is a block diagram of an inverter 102 in accordance with one or more embodiments of the present invention. The inverter 102 comprises a power conversion module 202, a controller 204, an AC voltage sampler 206, and a phase lock loop (PLL) 212.

The power conversion module 202 is coupled via two input terminals to the PV module 104, and via two output terminals to the commercial power grid. Additionally, the power conversion module 202 is coupled to the controller 204 and converts DC power from the PV module 104 to AC power in accordance with control and switching signals from the controller 204. The AC power produced is coupled to the commercial power grid such that it is in-phase with the AC grid voltage. In some embodiments, the power conversion module 202 may utilize a plurality of DC/DC converters coupled to a single DC/AC inverter. One example of such power conversion is commonly assigned U. S. Patent Application Publication Number 2007/0221267 entitled "Method and Apparatus for Converting Direct Current to Alternating Current" and filed Mar. 20, 2007, which is herein incorporated in its entirety by reference.

The AC voltage sampler 206 is coupled via two input terminals to the commercial power grid (i.e., at the output of the power conversion module 202) and via output terminals to the threshold detector 210 and to the PLL 212. The PLL 212 in turn is coupled via an output terminal to the controller 204, which is further coupled to the power conversion module 202 and to the threshold detector 210. The AC voltage sampler 206 provides a means for sampling the AC grid voltage and provides such samples to the PLL 212. In some embodiments, the AC voltage sampler 206 samples the AC grid voltage at a rate of 120 kilo samples per second; alternatively, faster or slower sampling rates may be utilized. Based on the received AC grid voltage samples, the PLL 212 provides a means for estimating the amplitude, phase, and frequency of the AC grid voltage waveform and provides a signal indicative of such information to the controller 204 and the threshold detector 210.

The controller 204 utilizes the received AC grid voltage waveform information (i.e., the estimated amplitude, phase, and frequency) for operative control of the power conversion module 202, as well as to define upper and lower bounds of an envelope in which the AC grid voltage is expected to range under normal operating conditions. In some embodiments, the controller 204 comprises a threshold generator 208 as a means for computing a first threshold ("upper bound") and a second threshold ("lower bound"), as described in detail below, and supplies the upper and lower bounds to the threshold detector 210. The computed upper and lower bounds are time-variant and form an envelope encompassing the nominal AC grid voltage waveform; in some embodiments, the envelope may be periodically updated, for example, every half line cycle or every line cycle. The controller 204 may further comprise a threshold detector 210 which provides a means for comparing AC grid voltage samples received from the AC voltage sampler 206 to the upper and lower bounds to determine whether the AC grid voltage waveform exceeds either of the bounds (i.e., crosses either of the thresholds). Such threshold crossings identify anomalous AC grid voltage activity that may be indicative of a grid voltage waveform failure which could negatively impact the power conversion performed by the inverter 102.

The threshold detector 210 may further provide a means for identifying such a failure by determining when "n" threshold crossings occur out of "p" consecutive AC grid voltage samples. When such a condition is satisfied, a failure of the grid voltage waveform is declared and the threshold detector 210 provides a means for causing the controller 204 to shut down (i.e., deactivate) the power conversion module 202 for a reset period, for example by generating a deactivate signal. In some embodiments, the reset period comprises the remainder of the AC grid cycle in which the failure is declared and additionally the subsequent AC grid cycle. Following the reset period, the controller 204 re-activates the power conversion module 202. Of course, longer or shorter reset periods may be used. In some alternative embodiments, the threshold generator 208 and/or the threshold detector 210 may be external to the inverter 102.

Figure 3:
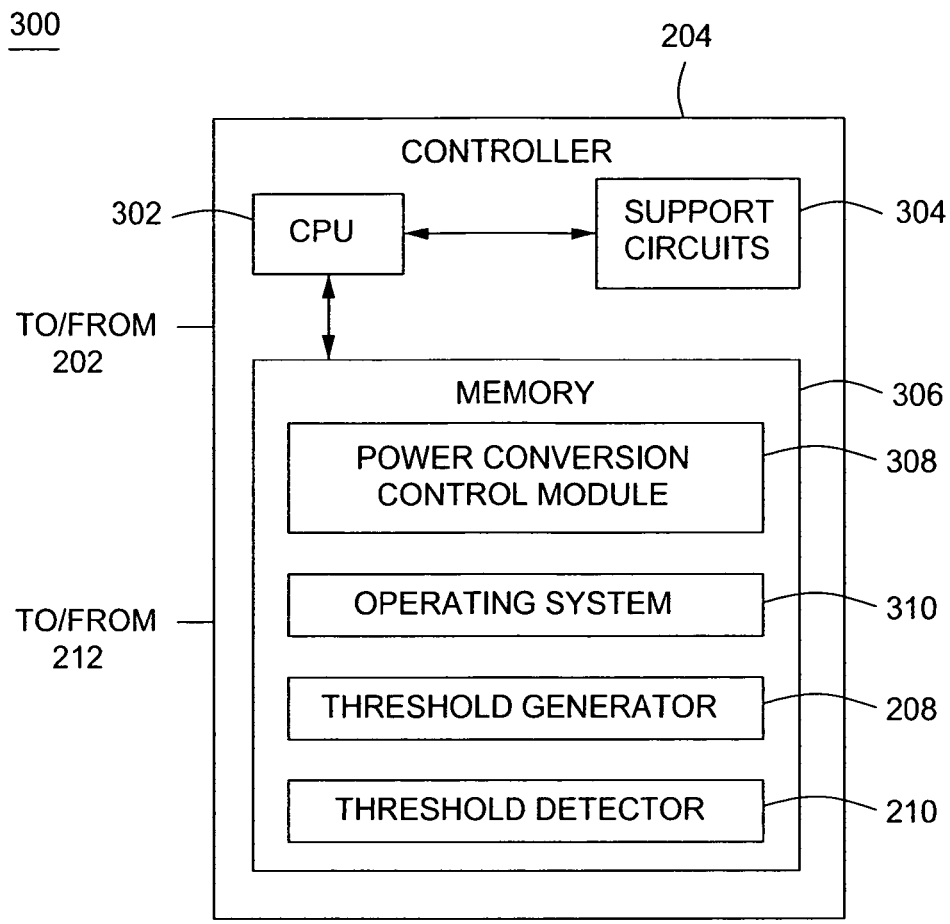
FIG. 3 is a block diagram of a controller in accordance with one or more embodiments of the present invention.

FIG. 3 is a block diagram of a controller 204 in accordance with one or more embodiments of the present invention. The controller 204 comprises at least one central processing unit (CPU) 302, which is coupled to support circuits 304 and to a memory 306. The CPU 302 may comprise one or more conventionally available microprocessors. Alternatively, the CPU 302 may include one or more application specific integrated circuits (ASICs). The support circuits 304 are well known circuits used to promote functionality of the central processing unit. Such circuits include, but are not limited to, a cache, power supplies, clock circuits, buses, network cards, input/output (I/O) circuits, and the like.

The memory 306 may comprise random access memory, read only memory, removable disk memory, flash memory, and various combinations of these types of memory. The memory 306 is sometimes referred to as main memory and may, in part, be used as cache memory or buffer memory. The memory 306 generally stores the operating system 310 of the controller 204. The operating system 310 may be one of a number of commercially available operating systems such as, but not limited to, Linux, Real-Time Operating System (RTOS), and the like.

The memory 306 may store various forms of application software, such as the threshold generator 208 and the threshold detector 210, as well as a power conversion control module 308 for controlling the operation of the power conversion module 202 (e.g., shutting down the power conversion module 202 in response to a received deactivate signal). The power conversion control module 308 may utilize the estimated AC grid voltage waveform amplitude, phase, and frequency from the PLL 212 to provide the control and switching signals for the power conversion module 202. Additionally, the threshold generator 208 may utilize the estimated AC grid voltage waveform amplitude, phase, and frequency information for computing the upper and lower bounds of the envelope in which the AC grid voltage is expected to range under normal operating conditions. Such upper and lower bounds (i.e., thresholds) are utilized to determine whether the AC grid voltage comprises anomalous zero-crossings that could adversely impact the power conversion performed by the inverter 102. In some embodiments, the power conversion control module 308, the threshold generator 208, and/or the threshold detector 210, or portions thereof, may be implemented in software, firmware, hardware, or a combination thereof.

In some embodiments, the threshold generator 208 computes the upper and lower bounds as follows:

$$\text{Upper bound} = (1+K_1) * V_{AC} \sin(\omega t) + K_2 * \text{sign}[\Phi], \text{ and} \quad (1)$$

$$\text{Lower bound} = (1-K_1) * V_{AC} \sin(\omega t) - K_2 * \text{sign}[\Phi] \quad (2)$$

Such time-variant upper and lower bounds define an envelope in which the AC grid voltage is expected to range under normal operating conditions. In the equations above, $K_1$ and $K_2$ are offset values determined in accordance with an expected variance of the AC grid voltage waveform due to distortion, sags, transients, and the like. In some embodiments, $K_1$ may be on the order of 0.2, and $K_2$ may be on the order of 0.1. $V_{AC} \sin(\omega t)$ is the nominal AC grid voltage, where $V_{AC}$ is a nominal maximum amplitude of the AC grid voltage, $\omega$ is the frequency of the AC grid voltage, t is time, and $\Phi$ is the phase of the AC grid voltage. For $0 < \Phi < \pi$, $\text{sign}[\Phi] = 1$; for $-\pi < \Phi < 0$, $\text{sign}[\Phi] = -1$. At the expected zero-crossings of the AC grid voltage, i.e., for $\Phi = 0, \pi$, no upper or lower bounds are set. Such "dead zones" in the envelope at the expected zero-crossings ensure that normally occurring AC grid voltage zero-crossings are not erroneously considered anomalies.

As previously described, the threshold detector 210 compares AC grid voltage samples to the computed upper and lower bounds in order to identify AC grid voltage anomalies. When "n" AC grid voltage anomalies are identified from "p" consecutive AC grid voltage samples, i.e., when a grid voltage waveform failure is identified, the threshold detector 210 provides a deactivate signal to the power conversion control module 308 to shut down the power conversion module 202 for a reset period.

Figure 4:
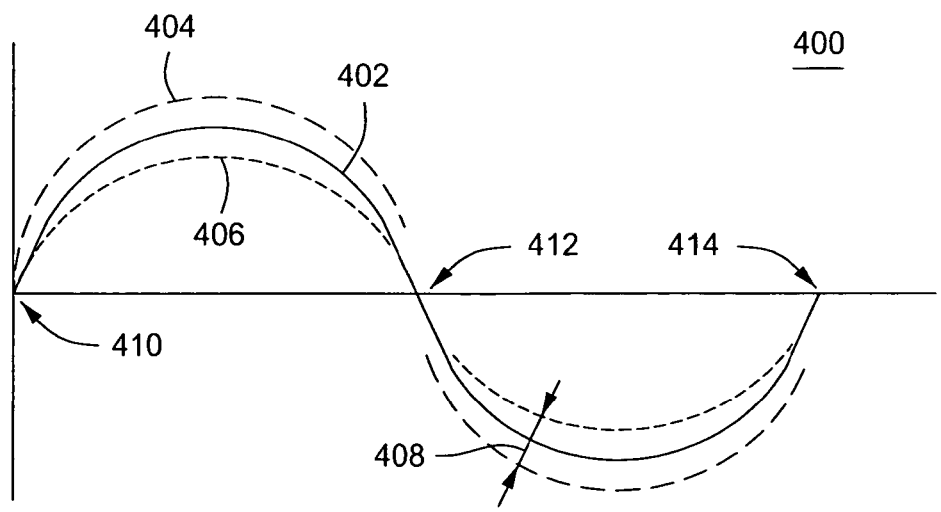
FIG. 4 is a graphical diagram of a time-variant envelope applied to an AC grid voltage waveform in accordance with one or more embodiments of the present invention.

FIG. 4 is a graphical diagram of a time-variant envelope 408 applied to an AC grid voltage waveform 402 in accordance with one or more embodiments of the present invention. FIG. 4 depicts a single cycle of an AC grid voltage waveform 402 under normal operating conditions. An upper bound 404 and a lower bound 406, computed as described above, comprise envelope 408 encompassing the nominal AC grid voltage waveform 402. At zero-crossings 410, 412, and 414, the lower bound 402 and the upper bound 404 are each boundless; i.e., at the zero-crossings 410, 412, and 414, no values are defined for either the lower bound 402 or the upper bound 404.

Figure 5:
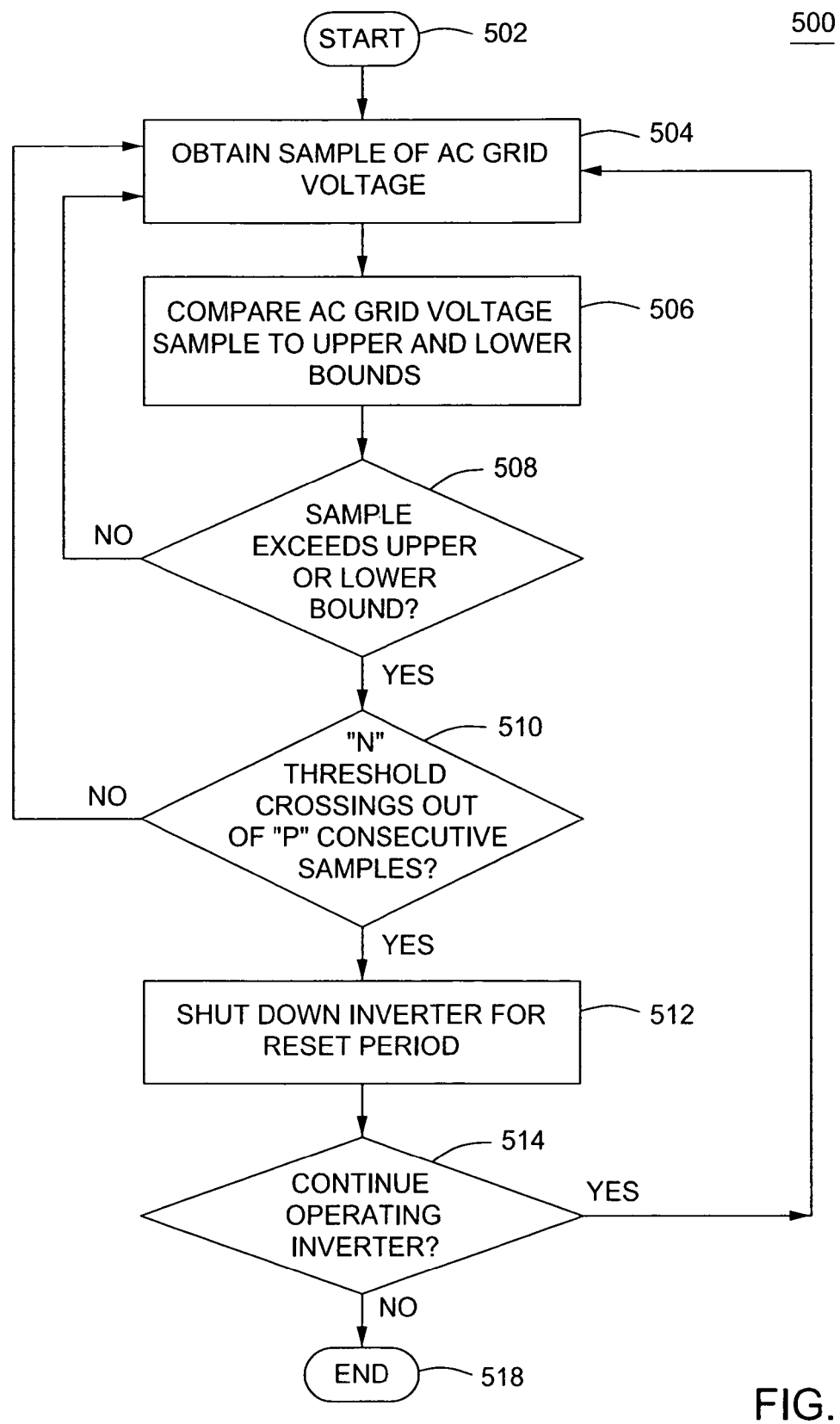
FIG. 5 is a flow diagram of a method for detecting anomalous AC grid voltage zero-crossings during power conversion in accordance with one or more embodiments of the present invention.

FIG. 5 is a flow diagram of a method 500 for detecting anomalous AC grid voltage zero-crossings during power conversion in accordance with one or more embodiments of the present invention. In some embodiments, such as the embodiment disclosed in relation to FIG. 5, an inverter is coupled to at least one PV module and to the commercial power grid, and converts DC power from the PV module(s) to AC power which is then coupled to the commercial power grid. The inverter may utilize a plurality of DC/DC converters coupled to a single DC/AC inverter. In some embodiments, a DC/DC converter may be coupled between the inverter and the PV module(s).

The method 500 begins at step 502 and proceeds to step 504, where a sample of the AC grid voltage is obtained. In some embodiments, the AC grid voltage is sampled, for example, at a rate of 120 kilo samples per second, by an AC voltage sampler within the inverter; alternatively, faster or slower sampling rates may be utilized. The method 500 proceeds to step 506, where the AC grid voltage sample is compared to an upper bound (i.e., a first threshold) and to a lower bound (i.e., a second threshold) of a time-variant envelope within which the AC grid voltage is expected to range under normal operating conditions (i.e., no grid voltage anomalies). In some embodiments, the upper and lower bounds are computed as described below with respect to FIG. 6.

At step 508, a determination is made whether the AC grid voltage sample exceeds either the upper or the lower bound; i.e., if a threshold crossing has occurred. Such threshold crossings identify anomalous AC grid voltage activity, in particular, irregular zero-crossings, which could negatively impact the power conversion performed by the inverter. In some embodiments, a threshold detector, such as the threshold detector 210, compares the AC voltage sample to the upper and lower bounds and determines whether an AC voltage waveform anomaly has occurred. If the condition at step 508 is not satisfied (i.e., no threshold crossings have occurred), the method 500 returns to step 504. If the condition at step 508 is satisfied (i.e., a threshold crossing has occurred), the method 500 proceeds to step 510.

At step 510, a determination is made (e.g., at the threshold detector) whether "n" threshold crossings have occurred out of "p" consecutive AC grid voltage samples, thereby indication a failure of the AC grid voltage. In some embodiments, a failure is declared when four threshold crossings occur out of six consecutive AC grid voltage samples. If the condition at step 510 is not satisfied (i.e., a failure has not occurred), the method 500 returns to step 504. If the condition at step 510 is satisfied (i.e., a failure has occurred), the method 500 proceeds to step 512, where the inverter is shut down for a reset period. The reset period may comprise the AC grid cycle in which the failure is declared, as well as with the subsequent AC grid cycle. In some embodiments, the threshold detector may transmit a "deactivate signal", for example, to a controller of the inverter, to shut down the inverter. Upon completion of the reset period, the inverter resumes operation; e.g., the controller may re-activate the inverter.

At step 514, a determination is made whether the operation of the inverter should continue. If the condition at step 514 is satisfied, the method 500 returns to step 504. If the condition at step 514 is not satisfied, the method 500 proceeds to step 518 where it ends.

Figure 6:
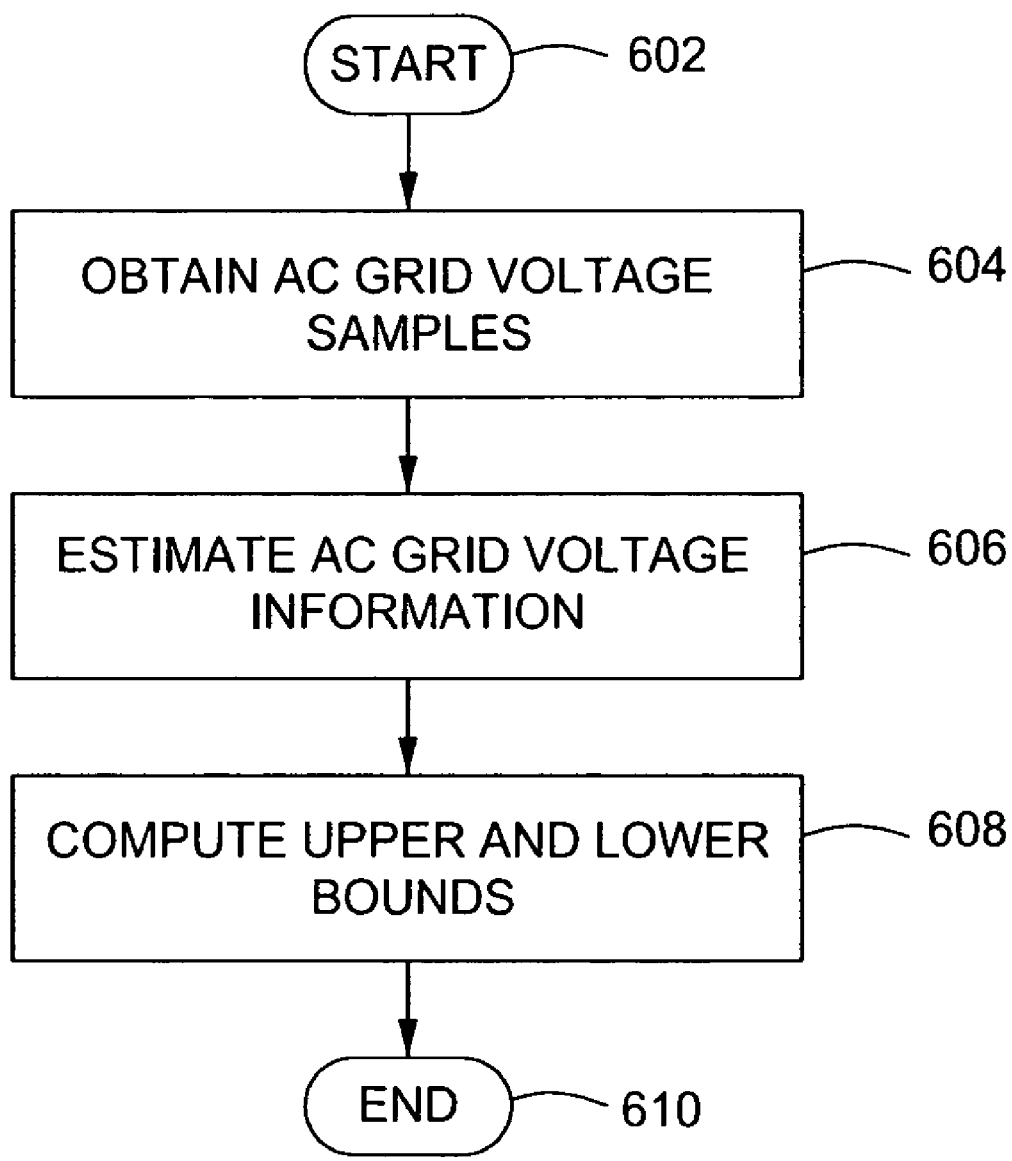
FIG. 6 is a flow diagram of a method for determining expected AC grid voltage waveform upper and lower bounds in accordance with one or more embodiments of the present invention.

FIG. 6 is a flow diagram of a method 600 for determining expected AC grid voltage waveform upper and lower bounds in accordance with one or more embodiments of the present invention. In some embodiments, such as the embodiment disclosed with respect to FIG. 6, the computed upper and lower bounds may be utilized by an inverter coupled to an AC power grid, such as an inverter 102, for identifying AC grid voltage failures that may adversely impact the power conversion performed by the inverter.

The method 600 starts at step 602 and proceeds to step 604. At step 604, samples of the AC grid voltage are obtained. The AC grid voltage samples may be obtained at a rate of 120 kilo samples per second; alternatively, a different sampling rate may be utilized. In some embodiments, the inverter may comprise an AC voltage sampler, such as the AC voltage sampler 206, for sampling the AC grid voltage.

The method 600 proceeds to step 606. At step 606, the AC grid voltage waveform amplitude, phase, and frequency are estimated based on the AC grid voltages samples. In some embodiments, a PLL of the inverter estimates such AC grid voltage waveform information; alternatively, such information may be estimated by a different component of the inverter or a component external to the inverter.

The method 600 proceeds to step 608. At step 608, the estimated AC grid voltage waveform amplitude, phase, and frequency are utilized to compute upper and lower bounds of a time-variant envelope in which the AC grid voltage waveform is expected to range under normal operating conditions. Such upper and lower bounds (i.e., thresholds) may be utilized to determine whether the AC grid voltage comprises anomalous zero-crossings that could adversely impact the power conversion performed by the inverter. In some embodiments, the upper and lower bounds may be computed by a controller of the inverter.

In some embodiments, the upper and lower bounds may be computed as follows:

$$\text{Upper bound} = (1+K_1)*V_{AC}\sin(\omega t) + K_2*\text{sign}[\Phi], \text{ and} \quad (3)$$

$$\text{Lower bound} = (1-K_1)*V_{AC}\sin(\omega t) - K_2*\text{sign}[\Phi] \quad (4)$$

where $K_1$ and $K_2$ are offset values based on expected variance of the AC grid voltage waveform due to distortion, sags, transients, and the like; in some embodiments, $K_1$ may be on the order of 0.2, and $K_2$ may be on the order of 0.1. $V_{AC}\sin(\omega t)$ is the nominal AC grid voltage, where $V_{AC}$ is a nominal maximum amplitude of the AC grid voltage, $\omega$ is the frequency of the AC grid voltage, t is time, and $\Phi$ is the phase of the AC grid voltage. For $0<\Phi<\pi$, $\text{sign}[\Phi]=1$; for $-\pi<\Phi<0$, $\text{sign}[\Phi]=-1$. At the expected zero-crossings of the AC grid voltage, i.e., for $\Phi=0$, $\pi$, no upper or lower bounds are set. Such "dead zones" in the envelope at the expected zero-crossings ensure that normally occurring zero-crossings of the AC grid voltage waveform are not erroneously identified as anomalies.

Upon computing the upper and lower bounds in step 608, the method 600 proceeds to step 610 where it ends.

While the foregoing is directed to embodiments of the present invention, other and further embodiments of the invention may be devised without departing from the basic scope thereof, and the scope thereof is determined by the claims that follow.

The invention claimed is:

1. An apparatus for determining AC voltage waveform anomalies, comprising:
   a threshold generator for generating at least one time-variant threshold based on information regarding an AC voltage waveform; and
   a threshold detector for comparing a sample of the AC voltage waveform to the at least one time-variant threshold to identify an AC voltage waveform anomaly.

2. The apparatus of claim 1, wherein the information comprises an amplitude, a phase, and a frequency of the AC voltage waveform.

3. The apparatus of claim 1, wherein the at least one time-variant threshold comprises a first and a second time-variant threshold.

4. The apparatus of claim 3, wherein the first and the second time-variant thresholds encompass an expected level of the AC voltage waveform.

5. The apparatus of claim 1, wherein the threshold detector identifies a failure when a first number of AC voltage waveform anomalies are identified from a second number of samples of the AC voltage waveform.

6. The apparatus of claim 5, wherein the threshold detector generates a signal for deactivating a power conversion as a result of identifying the failure.

7. The apparatus of claim 3, wherein the first and the second time-variant thresholds are boundless at expected zero-crossings of the AC voltage waveform.

8. The apparatus of claim 1, wherein the at least one time-variant threshold comprises (i) an upper bound of $(1+K_1)*V_{AC}\sin(\omega t)+K_2*\text{sign}[\Phi]$, and (ii) a lower bound of $(1-K_1)*V_{AC}\sin(\omega t)-K_2*\text{sign}[\Phi]$, wherein $K_1$ and $K_2$ are offset values, $V_{AC}$ is an amplitude of the AC voltage waveform, $\omega$ is a frequency of the AC voltage waveform, t is a time, $\Phi$ is a phase of the AC voltage waveform, $\text{sign}[\Phi]=1$ for $0<\Phi<\pi$, and $\text{sign}[\Phi]=-1$ for $-\pi<\Phi<0$.

9. A method for determining AC voltage waveform anomalies, at least a portion of the method being performed by a computing system comprising at least one processor, the method comprising:
   computing at least one time-variant threshold based on information regarding an AC voltage waveform; and
   comparing a sample of the AC voltage waveform to the at least one time-variant threshold to identify an AC voltage waveform anomaly.

10. The method of claim 9, further comprising:
    obtaining a plurality of samples of the AC voltage waveform; and
    determining an amplitude, a phase, and a frequency of the AC voltage waveform based on the plurality of samples for computing the at least one time-variant threshold.

11. The method of claim 9, further comprising identifying a failure when a first number of AC voltage waveform anomalies are identified from a second number of samples of the AC voltage waveform.

12. The method of claim 11, further comprising generating a signal for deactivating a power conversion as a result of identifying the failure.

13. The method of claim 9, wherein the at least one time-variant threshold comprises a first and a second time-variant threshold.

14. The method of claim 13, wherein the first and the second time-variant thresholds encompass an expected level of the AC voltage waveform.

15. The method of claim 13, wherein the first and the second time-variant thresholds are boundless at expected zero-crossings of the AC voltage waveform.

16. The method of claim 9, wherein computing the at least one time-variant threshold comprises computing (i) an upper bound of $(1+K_1)*V_{AC}\sin(\omega t)+K_2*\text{sign}[\Phi]$, and (ii) a lower bound of $(1-K_1)*V_{AC}\sin(\omega t)-K_2*\text{sign}[\Phi]$, wherein $K_1$ and $K_2$ are offset values, $V_{AC}$ is an amplitude of the AC voltage waveform, $\omega$ is a frequency of the AC voltage waveform, t is a time, $\Phi$ is a phase of the AC voltage waveform, $\text{sign}[\Phi]=1$ for $0<\Phi<\pi$, and $\text{sign}[\Phi]=-1$ for $-\pi<\Phi<0$.

17. The method of claim 12, further comprising resuming the power conversion subsequent to a reset period.

18. Apparatus for determining AC voltage waveform anomalies, comprising:
    means for computing at least one time-variant threshold based on information regarding an AC voltage waveform; and
    means for comparing a sample of the AC voltage waveform to the at least one time-variant threshold to identify an AC voltage waveform anomaly.

19. The apparatus of claim 18, further comprising means for identifying a failure when a first number of AC voltage waveform anomalies are identified from a second number of samples of the AC voltage waveform.

20. The apparatus of claim 19, further comprising means for generating a signal for deactivating a power conversion as a result of identifying the failure.

* * * * *